(12) United States Patent
Wig

(10) Patent No.: US 9,559,445 B2
(45) Date of Patent: Jan. 31, 2017

(54) CARD EDGE CONNECTORS

(71) Applicant: Intel Corporation, Santa Clara, CA (US)

(72) Inventor: Timothy Wig, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 91 days.

(21) Appl. No.: 14/575,318

(22) Filed: Dec. 18, 2014

(65) Prior Publication Data

US 2016/0181712 A1    Jun. 23, 2016

(51) Int. Cl.
| | | |
|---|---|---|
| *H01R 12/00* | (2006.01) | |
| *H01R 12/70* | (2011.01) | |
| *H01R 12/73* | (2011.01) | |
| *H05K 1/11* | (2006.01) | |

(52) U.S. Cl.
CPC ........ *H01R 12/7005* (2013.01); *H01R 12/737* (2013.01); *H05K 1/117* (2013.01)

(58) Field of Classification Search
CPC .......................... H01R 12/721; H01R 23/6873
See application file for complete search history.

(56) References Cited

U.S. PATENT DOCUMENTS

| | | | | |
|---|---|---|---|---|
| 4,806,103 A | * | 2/1989 | Kniese .................. | H05K 1/117 439/60 |
| 5,772,448 A | * | 6/1998 | Ekrot ..................... | H05K 1/117 439/60 |
| 6,768,645 B2 | * | 7/2004 | Kadonaga ............ | G06K 19/077 235/492 |
| 6,854,984 B1 | * | 2/2005 | Lee .................. | G06K 19/07732 439/607.41 |
| 7,316,570 B2 | * | 1/2008 | Ling ...................... | H05K 1/117 439/59 |
| 2014/0141654 A1 | | 5/2014 | Wig et al. | |
| 2014/0357105 A1 | | 12/2014 | Wig | |

OTHER PUBLICATIONS

Wig, et al., "Method, Apparatus, System for Improving Card Edge Connector Ground Return", U.S. Appl. No. 61/714,929, filed Oct. 17, 2012.

\* cited by examiner

*Primary Examiner* — Xuong Chung Trans
(74) *Attorney, Agent, or Firm* — International IP Law Group, P.L.L.C.

(57) ABSTRACT

Techniques for manufacturing an add-in card are described. An example of an add-in card in accordance with the described techniques includes a circuit board with contact fingers formed on an outer surface of the circuit board. Each of the contact fingers is configured to make electrical contact with a pin when inserted into a receptacle. The gap between the contact fingers is greater than or equal to a width of the pin. The add-in card also includes a protection mechanism to prevent the pin from being captured between the contact fingers if the add-in card is misaligned when inserted or removed.

16 Claims, 8 Drawing Sheets

300

400

500

600

700

800

CARD EDGE CONNECTORS

FIELD

This disclosure pertains to computing systems, and in particular (but not exclusively) to techniques for connecting electronic components via card edge connectors.

BACKGROUND

Card edge connectors tend to introduce a parasitic capacitance into the signals transmitted through such connectors. The parasitic capacitance is often the result of the extra conductive material used to ensure suitable mechanical tolerances. The parasitic capacitances tend to reduce signal integrity through increased insertion loss and return loss. The adverse effects of parasitic capacitance tend to be more pronounced at higher frequencies.

BRIEF DESCRIPTION OF THE FIGURES

The following detailed description may be better understood by referencing the accompanying drawings, which contain specific examples of numerous objects and features of the disclosed subject matter.

DETAILED DESCRIPTION

Figure 1:
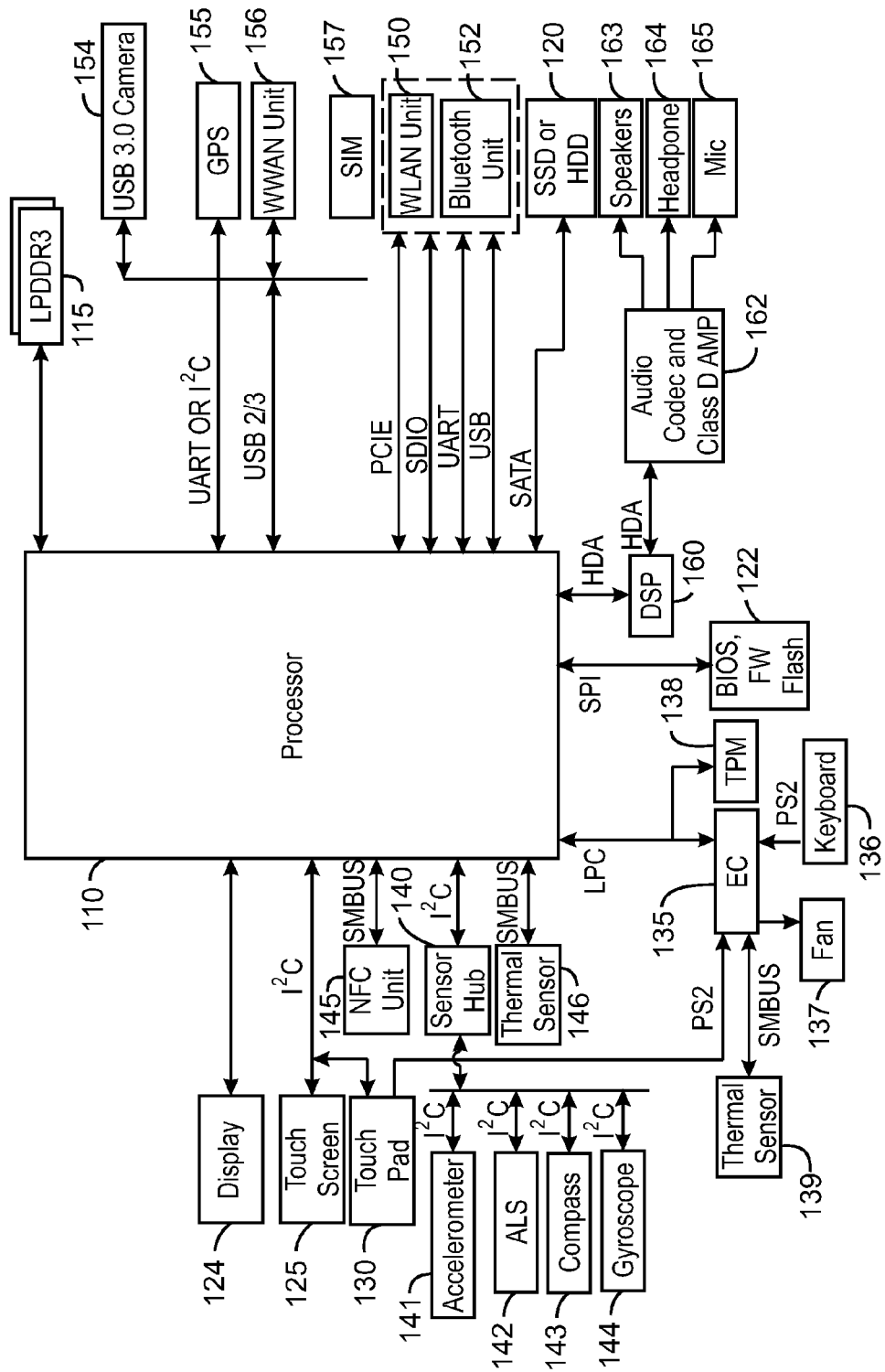
FIG. 1 illustrates an embodiment of a block diagram for a computing system.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

Referring now to FIG. 1, a block diagram of components present in a computer system in accordance with an embodiment of the present invention is illustrated. As shown in FIG. 1, system 100 includes any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 1 is intended to show a high level view of many components of the computer system. However, it is to be understood that some of the components shown may be omitted, additional components may be present, and different arrangement of the components shown may occur in other implementations.

As seen in FIG. 1, a processor 110, in one embodiment, includes a microprocessor, multi-core processor, multi-threaded processor, an ultra low voltage processor, an embedded processor, or other known processing element. In the illustrated implementation, processor 110 acts as a main processing unit and central hub for communication with many of the various components of the system 100. As one example, processor 100 is implemented as a system on a chip (SoC). As a specific illustrative example, processor 110 includes an Intel® Architecture Core™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitectural implementation may vary, but the architectural function of the processor is usually consistent.

Processor 110, in one embodiment, communicates with a system memory 115. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (Q17P). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 120 may also couple to processor 110. In various embodiments, to enable a thinner and lighter system design as well as to improve system responsiveness, this mass storage may be implemented via a SSD. However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 1, a flash device 122 may be coupled to processor 110, e.g., via a serial peripheral interface (SPI). This flash device may provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

Various input/output (IO) devices may be present within system 100. Specifically shown in the embodiment of FIG. 1 is a display 124 which may be a high definition LCD or LED panel configured within a lid portion of the chassis. This display panel may also provide for a touch screen 125, e.g., adapted externally over the display panel such that via a user's interaction with this touch screen, user inputs can be provided to the system to enable desired operations, e.g., with regard to the display of information, accessing of information and so forth. In one embodiment, display 124 may be coupled to processor 110 via a display interconnect that can be implemented as a high performance graphics interconnect. Touch screen 125 may be coupled to processor 110 via another interconnect, which in an embodiment can be an I2C interconnect. As further shown in FIG. 1, in addition to touch screen 125, user input by way of touch can also occur via a touch pad 130 which may be configured within the chassis and may also be coupled to the same I2C interconnect as touch screen 125.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6" or a 13.3" screen, and may have a 16:9 aspect ratio, and at least 300 nits brightness. Also the display may be of full high definition (HD) resolution (at least 1920×1080 p), be compatible with an embedded display port (eDP), and be a low power panel with panel self refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., Gorilla Glass™ or Gorilla Glass 2™) for low friction to reduce "finger burn"

and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited IO interference when using multi-touch.

For perceptual computing and other purposes, various sensors may be present within the system and may be coupled to processor 110 in different manners. Certain inertial and environmental sensors may couple to processor 110 through a sensor hub 140, e.g., via an I2C interconnect. In the embodiment shown in FIG. 1, these sensors may include an accelerometer 141, an ambient light sensor (ALS) 142, a compass 143 and a gyroscope 144. Other environmental sensors may include one or more thermal sensors 146 which in some embodiments couple to processor 110 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the OS may be a Microsoft® Windows® 8 OS that implements Connected Standby (also referred to herein as Win8 CS). Windows 8 Connected Standby or another OS having a similar state can provide, via a platform as described herein, very low ultra idle power to enable applications to remain connected, e.g., to a cloud-based location, at very low power consumption. The platform can supports 3 power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

Also seen in FIG. 1, various peripheral devices may couple to processor 110 via a low pin count (LPC) interconnect. In the embodiment shown, various components can be coupled through an embedded controller 135. Such components can include a keyboard 136 (e.g., coupled via a PS2 interface), a fan 137, and a thermal sensor 139. In some embodiments, touch pad 130 may also couple to EC 135 via a PS2 interface. In addition, a security processor such as a trusted platform module (TPM) 138 in accordance with the Trusted Computing Group (TCG) TPM Specification Version 1.2, dated Oct. 2, 2003, may also couple to processor 110 via this LPC interconnect. However, understand the scope of the present invention is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with the Universal Serial Bus Revision 3.0 Specification (November 2008), Revision 3.1 Specification, or later Universal Serial Bus specification, with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 100 can communicate with external devices in a variety of manners, including wirelessly. In the embodiment shown in FIG. 1, various wireless modules, each of which can correspond to a radio configured for a particular wireless communication protocol, are present. One manner for wireless communication in a short range such as a near field may be via a near field communication (NFC) unit 145 which may communicate, in one embodiment with processor 110 via an SMBus. Note that via this NFC unit 145, devices in close proximity to each other can communicate. For example, a user can enable system 100 to communicate with another (e.g.,) portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 1, additional wireless units can include other short range wireless engines including a WLAN unit 150 and a Bluetooth unit 152. Using WLAN unit 150, Wi-Fi™ communications in accordance with a given Institute of Electrical and Electronics Engineers (IEEE) 802.11 standard can be realized, while via Bluetooth unit 152, short range communications via a Bluetooth protocol can occur. These units may communicate with processor 110 via, e.g., a USB link or a universal asynchronous receiver transmitter (UART) link. Or these units may couple to processor 110 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 156 which in turn may couple to a subscriber identity module (SIM) 157. In addition, to enable receipt and use of location information, a GPS module 155 may also be present. Note that in the embodiment shown in FIG. 1, WWAN unit 156 and an integrated capture device such as a camera module 154 may communicate via a given USB protocol such as a USB 2.0 or 3.0 link, or a UART or I2C protocol. Again the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multi-function device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 160, which may couple to processor 110 via a high definition audio (HDA) link. Similarly, DSP 160 may communicate with an integrated coder/decoder (CODEC) and amplifier 162 that in turn may couple to output speakers 163 which may be implemented within the chassis. Similarly, amplifier and CODEC 162 can be coupled to receive audio inputs from a microphone 165 which in an embodiment can be implemented via dual array microphones (such as a digital microphone array) to provide for high quality audio inputs to enable voice-activated control of various operations within the system. Note also that audio outputs can be provided from amplifier/CODEC 162 to a headphone jack 164. Although shown with these particular components in the embodiment of FIG. 1, understand the scope of the present invention is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 110 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

In one embodiment, a sustain power plane can be used during some deep sleep states to power on the I/O pins for several I/O signals, such as the interface between the processor and a PCH, the interface with the external VR and the interface with EC 135. This sustain power plane also powers an on-die voltage regulator that supports the on-board SRAM or other cache memory in which the processor context is stored during the sleep state. The sustain power plane is also used to power on the processor's wakeup logic that monitors and processes the various wakeup source signals.

During power management, while other power planes are powered down or off when the processor enters certain deep sleep states, the sustain power plane remains powered on to support the above-referenced components. However, this can lead to unnecessary power consumption or dissipation when those components are not needed. To this end, embodiments may provide a connected standby sleep state to maintain processor context using a dedicated power plane. In one embodiment, the connected standby sleep state facilitates processor wakeup using resources of a PCH which itself may be present in a package with the processor. In one embodiment, the connected standby sleep state facilitates sustaining processor architectural functions in the PCH until processor wakeup, this enabling turning off all of the unnecessary processor components that were previously left powered on during deep sleep states, including turning off all of the clocks. In one embodiment, the PCH contains a time stamp counter (TSC) and connected standby logic for controlling the system during the connected standby state. The integrated voltage regulator for the sustain power plane may reside on the PCH as well.

In an embodiment, during the connected standby state, an integrated voltage regulator may function as a dedicated power plane that remains powered on to support the dedicated cache memory in which the processor context is stored such as critical state variables when the processor enters the deep sleep states and connected standby state. This critical state may include state variables associated with the architectural, micro-architectural, debug state, and/or similar state variables associated with the processor.

The wakeup source signals from EC 135 may be sent to the PCH instead of the processor during the connected standby state so that the PCH can manage the wakeup processing instead of the processor. In addition, the TSC is maintained in the PCH to facilitate sustaining processor architectural functions. Although shown with these particular components in the embodiment of FIG. 1, understand the scope of the present invention is not limited in this regard.

Power control in the processor can lead to enhanced power savings. For example, power can be dynamically allocate between cores, individual cores can change frequency/voltage, and multiple deep low power states can be provided to enable very low power consumption. In addition, dynamic control of the cores or independent core portions can provide for reduced power consumption by powering off components when they are not being used.

Some implementations may provide a specific power management IC (PMIC) to control platform power. Using this solution, a system may see very low (e.g., less than 5%) battery degradation over an extended duration (e.g., 16 hours) when in a given standby state, such as when in a Win8 Connected Standby state. In a Win8 idle state a battery life exceeding, e.g., 9 hours may be realized (e.g., at 150 nits). As to video playback, a long battery life can be realized, e.g., full HD video playback can occur for a minimum of 6 hours. A platform in one implementation may have an energy capacity of, e.g., 35 watt hours (Whr) for a Win8 CS using an SSD and (e.g.,) 40-44 Whr for Win8 CS using an HDD with a RST cache configuration.

A particular implementation may provide support for 15 W nominal CPU thermal design power (TDP), with a configurable CPU TDP of up to approximately 25 W TDP design point. The platform may include minimal vents owing to the thermal features described above. In addition, the platform is pillow-friendly (in that no hot air is blowing at the user). Different maximum temperature points can be realized depending on the chassis material. In one implementation of a plastic chassis (at least having to lid or base portion of plastic), the maximum operating temperature can be 52 degrees Celsius (C). And for an implementation of a metal chassis, the maximum operating temperature can be 46° C.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TXT), and Intel® Manageability Engine Technology along with secure user interfaces such as a secure keyboard and display.

At least one of the components described in FIG. 1 are communicatively coupled via card edge connectors. Various techniques for improving the electrical characteristics of card edge connectors are discussed in more detail below. Furthermore, it should be understood that the system 100 of FIG. 1 is just one example of a system in which the present techniques may be implemented. Indeed, the techniques described herein can be used in any electronic device that uses a card edge connector. Such electronic devices may include server computers, desktop computers, laptop computers, tablet computers, and smart phones, among others.

Figure 2:
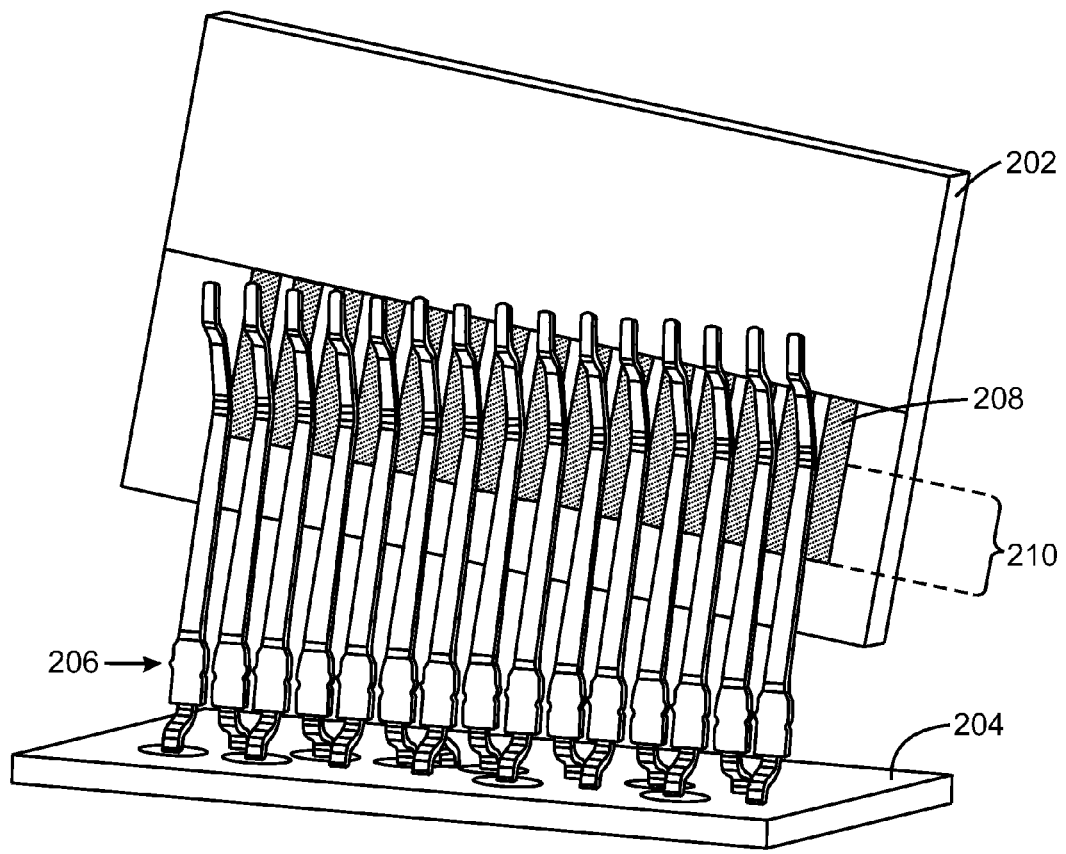
FIG. 2 is a perspective view of a card edge connector.

FIG. 2 is a perspective view of a card edge connector. The card edge connector 200 facilitates a communicative coupling between components of an add-in-card 202 and components coupled to a baseboard 204. The baseboard 204 may be a circuit board included in any type of suitable electronic device. For example, the baseboard 204 may be a motherboard of a Desktop computer, laptop computer, server, and the like. The add-in card 202 may be any type of suitable electronic component or module, and can add a specific functionality to the basic functions provided by components of the baseboard 204. For example, the add-in card 202 may be a graphics accelerator, network interface card, wireless communication interface, a memory module such a Dual-Inline Memory Modules (DIMM), or passive bus riser card mounting additional card edge connectors, among others. As used herein, the term card edge connector is used to refer to the components of both the add-in card 202 and the baseboard 204 that mechanically and electrically facilitate the communicative coupling between the add-in card 202 and the baseboard 204.

The baseboard 204 includes a plurality of contacts referred to herein as pins 206. Each of the pins 206 may be routed to electronic components of the baseboard 204 through conductors disposed within or on the surface of the baseboard 204. The add-in card 202 includes a plurality of conductive contacts referred to herein as contact fingers 208. The contact fingers 208 are configured to make contact with a respective pin when the add-in card 202 is coupled to the baseboard 204. At least some of the contact fingers 208 are routed to electronic components of the add-in card 202 through conductors disposed within or on the surface of the add-in card 202. The card edge connector 200 also includes a non-conductive connector shell (not shown) that facilitates the mechanical coupling between add-in card 202 and the baseboard 204. In some examples, the add-in card 202 and the pins 206 of the baseboard 204 are manufactured in accordance with PCIe specification, including Generations 1, 2, 3, or 4 of the PCIe specification.

Each pin 206 and its corresponding contact finger 208 may be assigned a specific functionality. For example, some pins may be ground pins coupled to a reference plane, while other pins may be signal pins coupled to specific components of the baseboard. In some embodiments, the specific arrangement of pins, also referred to as the pin assignment, is determined by a manufacturer of the baseboard device or a by an industry specification such as the PCIe SIG CEM specification, among others.

Mechanical tolerances are used in card edge connectors to ensure a reliable electrical coupling between mating edge connectors and add-in cards that might be misaligned or subject to dimensional variation due to manufacturing deviations. For example, the length of the contact fingers 208 may be specified to allow some mechanical "over travel" beyond the length required for electrical coupling when the add-in card and connector socket are suitably aligned. This results in a conductive stub 210 of conductor in the contact finger 208. The conductive stub 210 contributes to the parasitic capacitances of the edge connector and tends to reduce signal quality.

The width of the contact fingers 208 can be selected to prevent mechanical damage to the pins 206 during insertion and removal of the add-in card. One way in which damage could occur is through an effect known as zippering. The surface of each contact finger 208 may be raised compared to the surface of the add-in card 202. If the add-in card 202 is inserted or removed at an angle as shown in FIG. 2, it may be possible for the pins 206 to slip between the contact fingers 208 and become captured in the space between the contact fingers 208, which can result in bent pins 206 and damage to the contact fingers 208. To prevent this, the width of the contact fingers 208 can be selected so that the gap between contact fingers 208 is greater than the width of the pins 206. In this way, the pins 206 will ride over the contact fingers 208 even if inserted or removed at an angle. However, the increasing the width of the contact fingers 208 increases the capacitance of the conductive stub 210, resulting in greater signal reflections and reduced signal quality. The present disclosure describes protection mechanisms that can prevent zippering and also improve the electrical performance of the edge connector by reducing the parasitic capacitance of the contact fingers 208.

Figure 3:
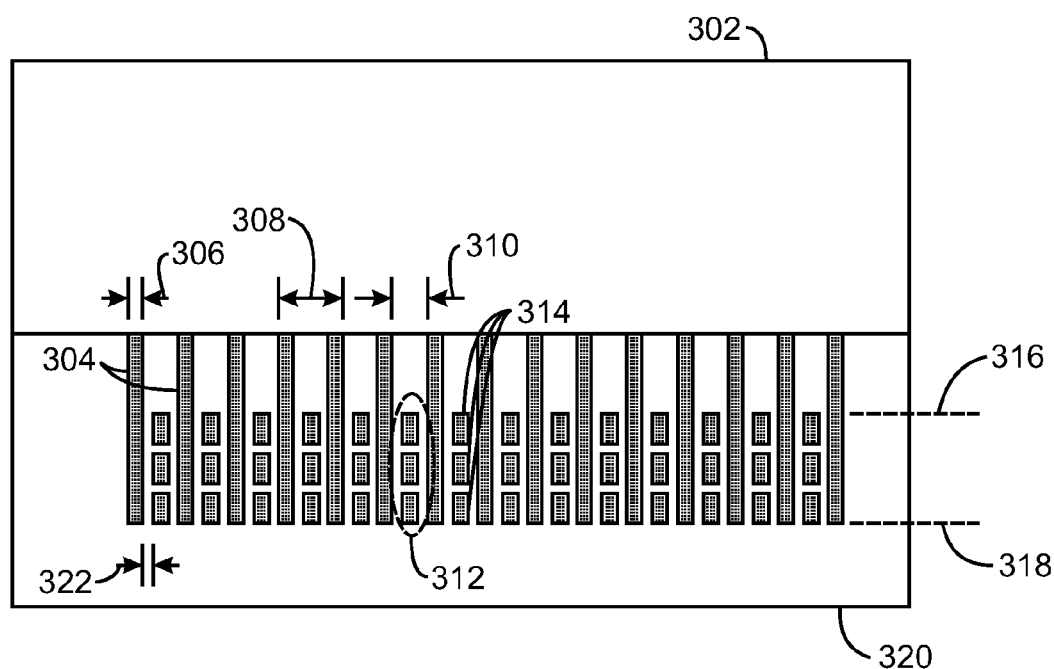
FIG. 3 is a front view of an example of an add-in card.

FIG. 3 is a front view of an example of an add-in card. The add-in card 302 is configured to be inserted into a receptacle (not shown) such that the contact fingers 304 will make contact with corresponding pins (not shown). In some examples, the add-in card is compliant with a PCIe Card Electromechanical Specification. However, other protocols may also be used. Each communication lane of the add-in card 202 may also be configured to transmit and/or receive electrical signals at frequencies greater than 8.0 GigaHertz (GHz). However, other frequency ranges are also possible.

To improve the electrical characteristics of the add-in card 302, the contact fingers 304 have a reduced width, for example, a width less than 0.7 mm. In the example shown in FIG. 3, the width 306 of each contact finger 304 may be approximately 0.3 to 0.5 millimeters (mm). The center-to-center distance 308 between the contact fingers 304 may be approximately 1.0 mm, resulting in a gap 310 between contact fingers 304 of approximately 0.5 to 0.7 mm. In some implementations, the width of the pins (not shown) may be approximately 0.4 mm at the contact point. Thus, the gap 310 between contact fingers 304 is larger than the width of the pins that are expected to mate with the contact fingers 304.

In some examples, the add-in card 302 and the receptacle do not include an alignment mechanism. Thus, the add-in card 302 could be misaligned when inserted into or removed from the receptacle. For example, the add-in card 302 may be angled as shown in FIG. 2. To prevent zippering, the add-in card 302 includes a protection mechanism that prevents prevent the pins from being captured between the contact fingers 304 if the add-in card is misaligned during insertion or removal. In the example of FIG. 3, the protection mechanism is a support step 312, which is disposed between the contact fingers 304. The support steps 312 may be raised pads that support the pins during insertion and removal of the add-in card 302 to prevent the pins from slipping between the contact fingers 304. The support steps 312 prevent zippering in the event that the add-in card is misaligned when inserted into the receptacle. In some examples, the support steps are raised metal pads. However, other materials are also possible, including dielectric materials, conductive polymers, and others.

In some cases, the support steps 312 may have a small effect on the electrical characteristics of contact fingers 304. To reduce the electrical effect of the support steps 312 and reduce the chance of creating a short circuit, the support steps 312 may be disposed in segments 314. For example, FIG. 3 shows the support step 312 as including three support step segments 314 between each pair of contact fingers 304. However, any suitable number of support step segments 314 may be used, including 2, 4, 5, or more. Furthermore, the support step 312 may be a single unit that is not segmented.

The support steps 312 may be pads of metal, such as copper, which are electrically isolated from each of the contact fingers 304. In some examples, the support steps 312 are fabricated during the same metal patterning phase that is used to fabricate the contact fingers 304.

The placement and dimensions of the support steps 312 may be vary in accordance with the design considerations for a particular implementation. In FIG. 3, the location where a pin would be expected to contact the contact fingers 304 is identified as contact point 316, which is shown as a dotted line. In some examples, the support steps 312 are vertically positioned between the contact point 316 and the bottom end 318 of the contact fingers 304. However, the support steps 312 could extend above or below these boundaries. For purposes of the present description, the "bottom" end of the contact finger refers to the end that is nearest to the insertion edge 320.

The width of the support steps may be selected to provide a suitable gap 322 between the edge of the support steps 312 and the edge of the contact finger 304. For example, the width of the support steps 312 may be selected so that the gap 322 is less than the width of the pins expected to couple to the contact fingers 304. In the example of FIG. 3, the width of the support steps 312 may be approximately 0.3 mm, resulting in gap 322 of approximately 0.2 mm.

The add-in card shown in FIG. 3 is one example of an add-in card with improved electrical characteristics and a protection mechanism that prevents zippering. Various modifications may be implemented within scope of this present invention. For example, it will be understood that the techniques are not limited to the specific dimensions described herein. Another example of an add-in card in accordance with the present techniques is described below in relation to FIG. 4.

Figure 4:
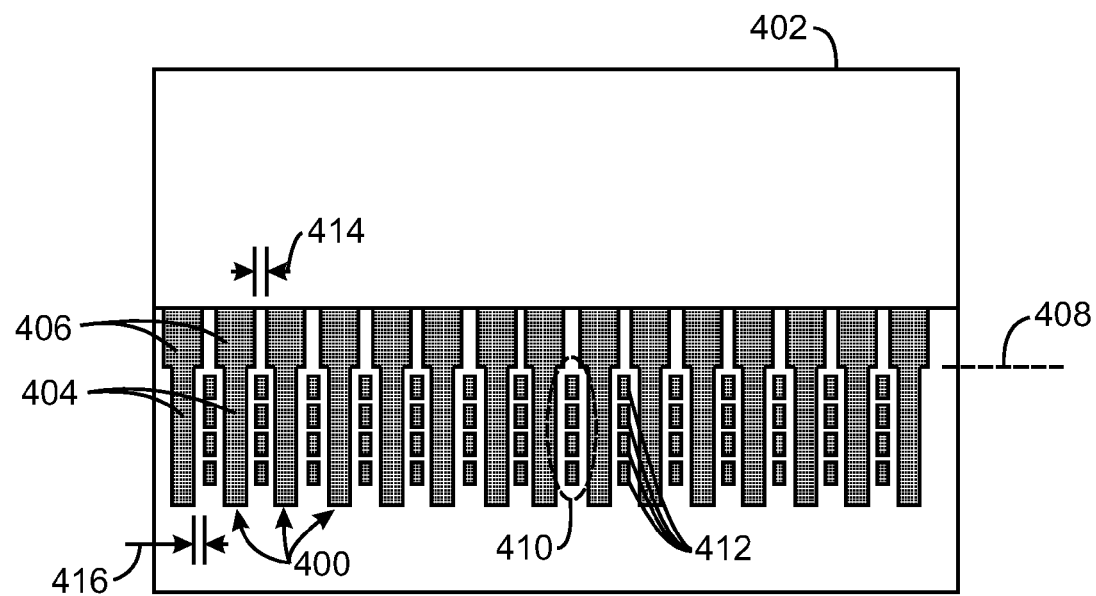
FIG. 4 is a front view of another example of an add-in card.

FIG. 4 is a front view of another example of an add-in card. As shown in FIG. 4, the contact fingers 400 of the add-in card 402 are each made of two portions 404 and 406, each portion with a different width. The contact fingers 400 of FIG. 4 may be referred to as T-shaped. In some examples, the two portions 404 and 406 meet at approximately the position where the pins would be expected to contact the contact fingers 400, which is shown as contact point 408. However, the two portions 404 and 406 may meet above or below the contact point 408.

The narrower portion 406 is disposed below the contact point 408, i.e., toward the insertion edge, and forms a capacitive stub. In the example shown in FIG. 4, the width of the wider portion 406 is approximately 0.7 mm, and the width of the narrower portion 404 is approximately 0.3 mm. The wider portions 406 will generally behave electrically as transmission paths for signals received through the pins (not shown). Therefore, leaving the contact fingers 400 wider above the contact point 408, as shown in FIG. 4, will generally not have a substantial effect on electrical characteristics of the contact fingers 400.

In addition to the T-shaped contact fingers 400, the add-in card 402 also includes support steps 410. Each support step 410 is divided into four segments 412 as compared to the three support step segments shown in FIG. 3. As in FIG. 3, the widths of the support steps 410 are selected to ensure that the pins (not shown) cannot slip into the gap between the contact fingers 400. For example, in FIG. 4, the width 414 of the support steps 410 is approximately 0.3 mm, which is also the width of the gap between the wider portions 406 of the contact fingers 400. The resulting gap 416 between the edge of the nearest contact finger 400 and the edge of the support step 412 is approximately 0.2 mm.

FIGS. 3 and 4 are examples of protection mechanisms that can be fully implemented in the add-in card, without any changes to the pins. Thus, for a particular connector specification, the add-in card will be physically backward compatible with previous baseboard designs. However, as described further below, the protection mechanism to prevent zippering can also be implemented in the pins.

Figure 5:
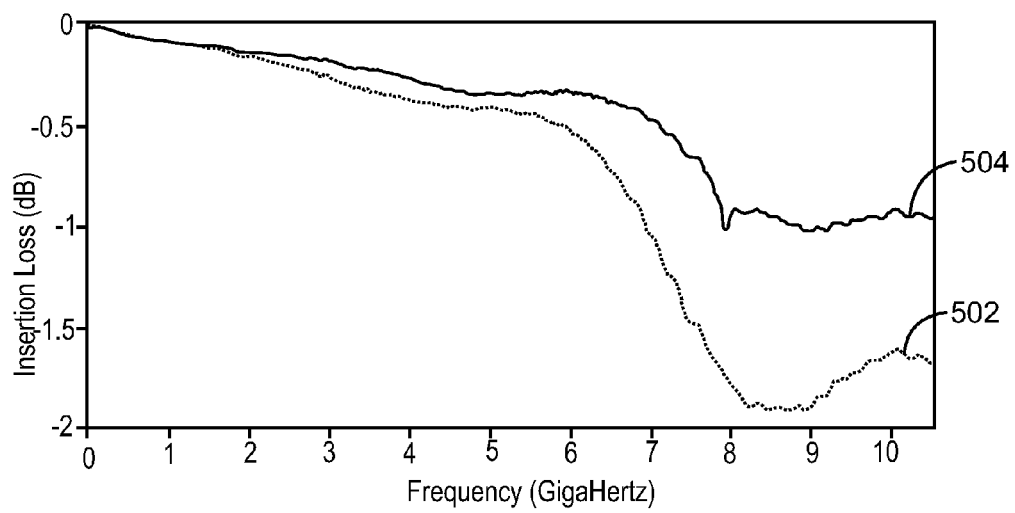
FIG. 5 is an insertion loss diagram showing the electrical response of an add-in-card, such as the add-in card shown in FIG. 3.

FIG. 5 is an insertion loss diagram showing the electrical response of an add-in card, such as the add-in card 302 shown in FIG. 3. The y-axis represents insertion loss measured in decibels, and the x-axis represents frequency in Gigahertz. Insertion loss describes the loss of signal magnitude across a transmission path and is one factor that tends to limit the performance of some communication paths. As the frequency of a signal increases, the insertion loss also tends to increase, which is shown in FIG. 5 as a more negative decibel level.

The dotted line 502 represents the baseline electrical response of an add-in card, such as the add-in card 202 shown in FIG. 2, which includes the wider contact fingers 208 and does not include support steps. The solid line 504 represents the electrical response of an add-in card with 0.3 mil wide contact fingers and support steps disposed between the each of the contact fingers. As shown in FIG. 5, the insertion loss is markedly improved above 6 GHz, and is reduced by approximately 0.6 to 0.9 dB between 8 and 10 GHz for the add-in card with the narrower contact fingers and stepping stones, compared to the baseline. Accordingly, it can be seen that the techniques described herein may be especially useful with communication frequencies above 6.0 Gigahertz, as in the PCIe Gen 4 protocol.

Figure 6:
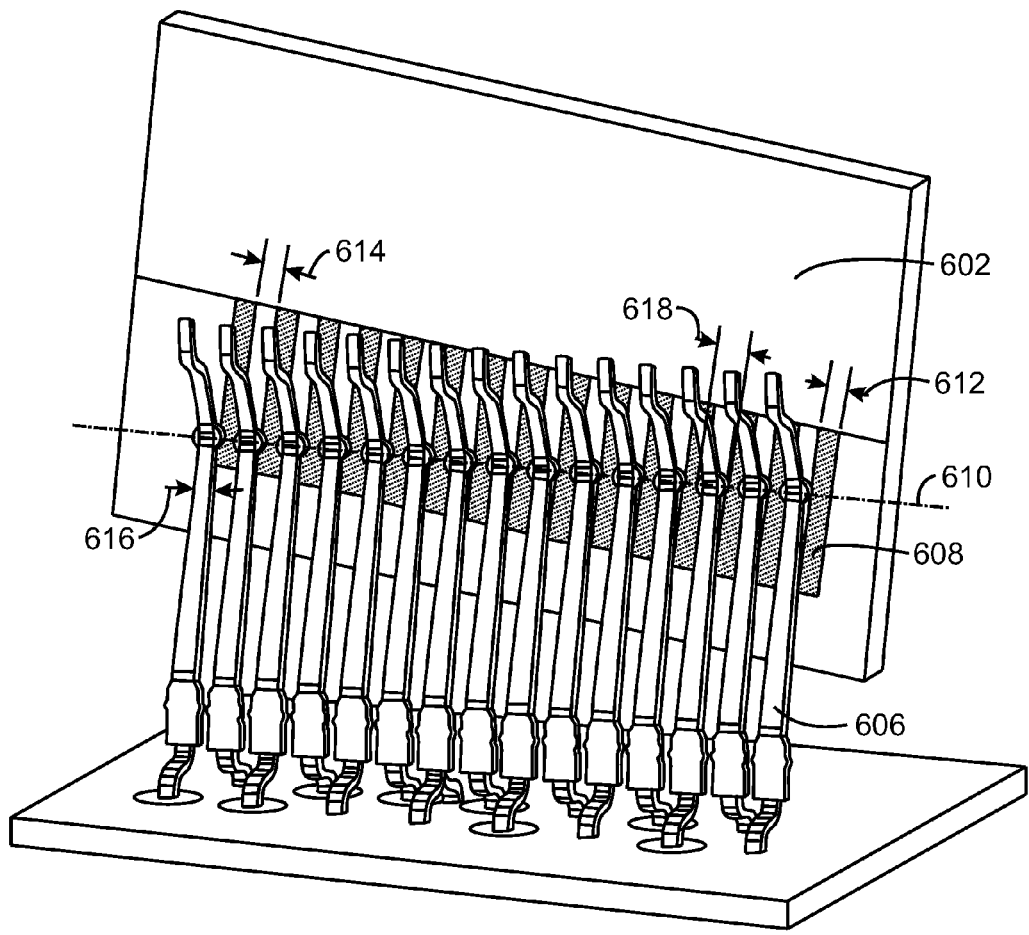
FIG. 6 is perspective view of a card edge connector showing another example of a protection mechanism that can be used to enable narrower contact fingers.

FIG. 6 is perspective view of a card edge connector showing another example of a protection mechanism that can be used to enable narrower contact fingers. As explained above, the card edge connector 600 includes the components of both the add-in card 602 and the baseboard 604 that facilitate the communicative coupling between the add-in card 602 and the baseboard 604. This includes the pins 606 of the baseboard 604 and the contact fingers 608 of the add-in card 602. The pins 606 may be shaped to provide a contact point. For example, the pins 606 shown in FIG. 6 are curved to create a contact point at the outermost portion of the curve, which is shown by the dotted line 610. However, other configurations are also possible.

In the example shown in FIG. 6, the width 612 of the contact fingers 608 may be approximately 0.3 to 0.6 mm, and the gap 614 between the contact fingers 608 may be approximately 0.4 to 0.7 mm. The width 616 of the pins 606 near the contact point can be equal to or less the gap 614 between the contact fingers 608. For example, the width 616 of the pins 606 near the contact point may be approximately 0.4 mm. Furthermore, unlike FIGS. 3 and 4, the add-in card does not include support steps. Rather, the protection mechanism to prevent zippering is included in the pins 606. As shown in FIG. 6, each of the pins 606 is widened at the contact point. At the contact point, the width 618 of the pin 606 is greater than the gap 614 between the contact fingers 608. In some examples, the width 618 of the pin 606 at the contact point may be approximately 0.5 to 0.8 mm, depending on the width of the gap 614 between the contact fingers 608. In some examples, the widened portion of the pin 606 may be rounded as shown in FIG. 6. However, other shapes are possible, including square or rectangular. In some examples, the edges of the widened portion of the pin 606 are curved outward to create a dish shape. It will be understood that the example configurations shown herein are not limitations of the present invention and various other configurations may become apparent to those of ordinary skill in the art having the benefit of the present disclosure.

Figure 7:
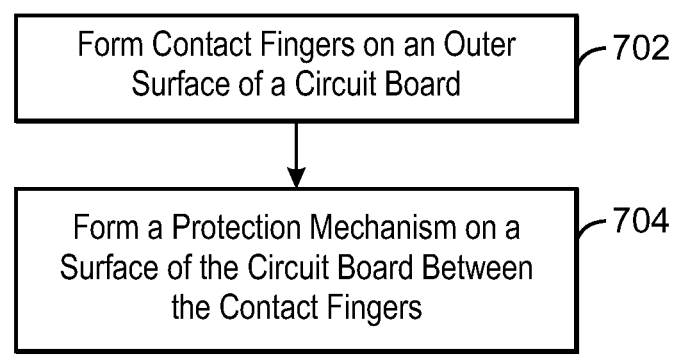
FIG. 7 is a process flow diagram summarizing a method of manufacturing an electronic device.

FIG. 7 is a process flow diagram summarizing a method of manufacturing an electronic device. The method may be referred to herein with the reference number 700. The electronic device may be an add-in card such as the add-in card 302 or 402 described above.

At block 702, contact fingers may be formed on an outer surface of a circuit board. Each of the contact fingers is configured to make electrical contact with a pin when the circuit board is inserted into a receptacle. The receptacle is part of a card edge connector that can receive the add-in card. The width of the contact fingers is selected such that a gap between the contact fingers is greater than or equal to a width of the pin. Contact fingers may be formed by any suitable technique for forming metal traces on a circuit board. For example, the resonator may be formed using any suitable metal deposition techniques, metal patterning, photolithography, and other processes. In some examples, the contact fingers are formed within a region that is reserved for edge contact fingers in accordance with a electromechanical specification such as PCIe, Gen 1, Gen 2, Gen 3, Gen 4, or later generation.

In some examples, the contact fingers are T-shaped and formed in two different portions, a wider upper portion and a narrower lower portion. The narrower lower portion is positioned below a point at which the pin is to make contact the contact finger when fully inserted and forms a capacitive stub. The wider upper portion is positioned above the point at which the pin is to make contact the contact finger when fully inserted and electrically couples the contact finger to signal traces on circuit board of the add-in card.

At block 704, a protection mechanism is formed on a surface of the circuit board between the contact fingers. The protection mechanism prevents damage to the pins and contact fingers during insertion and removal. In some examples, the protection mechanism is a support step and forming the protection mechanism includes forming metal pads between the contact fingers and electrically isolating the metal pads from the contact fingers. Forming the metal pads can include forming each of the metal pads in a plurality of electrically isolated segments. The support steps and the contact fingers may be formed during the same stage of a PCB fabrication process, for example, during the same metal patterning stage. The contact fingers and the support steps may also be formed from the same material and with the same thickness.

It will be understood that the method described herein can include many additional fabrication details. Furthermore, the method 700 should not be interpreted as implying that the actions have to be performed in any specific order. It will be appreciated that any number of additional actions may be included within the method 700, depending on the specific implementation. For example, the method 700 may include the formation of additional signal traces, vias, mounting structures, and passive electronic components, among others.

Figure 8:
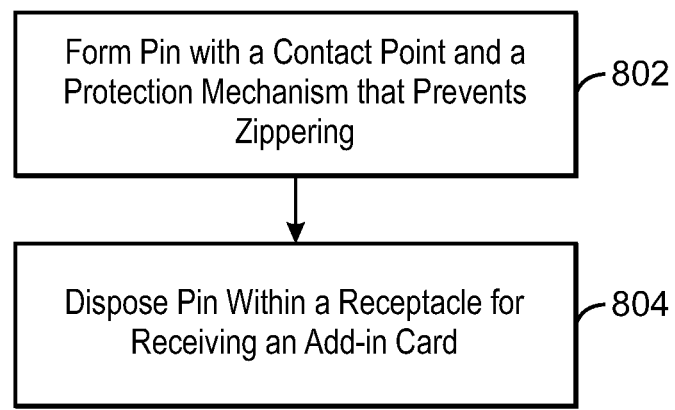
FIG. 8 is a process flow diagram summarizing another method of manufacturing an electronic device.

FIG. 8 is a process flow diagram summarizing another method of manufacturing an electronic device. The method may be referred to herein with the reference number 800. The electronic device may be configured to receive an add-in card such as the add-in card 302 or 402 described above.

At block 802, one or more pins are formed. The pins are electrical contact pins, which are configured to electrically couple to corresponding contact fingers of an add-in card. In some examples, the pins and the add-in card are in accordance with a PCIe Card Electromechanical Specification. The pins may be shaped in such a way as to create a contact point, which is the part of the pin that will make contact with the contact finger. An example pin is shown in FIGS. 2 and 6. Forming the pins also includes forming a protection mechanism that prevents zippering. The protection mechanism prevents the pin from being able to be captured between the contact fingers. In some examples, the protection mechanism is a widened portion at the contact point of the pin, as shown in FIG. 6, so that the contact point is wider than the expected gap between the contact fingers. At block 804, the pins are disposed within a receptacle that is configured to receive the add-in card.

It will be understood that the method described herein can include many additional fabrication details. Furthermore, the method 800 should not be interpreted as implying that the actions have to be performed in any specific order. It will be appreciated that any number of additional actions may be included within the method 800, depending on the specific implementation.

EXAMPLES

Examples may include subject matter such as a method, means for performing acts of the method, at least one machine-readable medium including instructions that, when performed by a machine cause the machine to performs acts of the method, or of an apparatus or system for managing power consumption according to embodiments and examples described herein.

Example 1 is an add-in card, which includes a circuit board and contact fingers disposed on an outer surface of the circuit board. Each of the contact fingers is configured to make electrical contact with a pin when inserted into a receptacle. A gap between the contact fingers is greater than or equal to a width of the pin. The add-in card also includes a protection mechanism to prevent the pin from being captured between the contact fingers if the add-in card is misaligned when inserted or removed. Optionally, the add-in card may be compliant with a PCIe Card Electromechanical Specification. A width of the contact fingers may be less than or equal to 0.7 mm. The add-in card may also be optionally configured to transmit electrical signals at a frequency greater than 4.0 GigaHertz (GHz).

Example 2 is an add-in card that includes the subject matter of example 1, either including or omitting optional features, and wherein the protection mechanism is a support step disposed between each of the contact fingers. Optionally, the support step comprises may be plurality of support step segments that are electrically isolated from one another. The support step may also optionally be a raised metal pad that is electrically isolated from each of the contact fingers.

Example 3 is an add-in card that includes the subject matter of example 2, either including or omitting optional features, and wherein a gap between an edge of the support step and an edge of a nearest contact finger is less than a width of the pin.

Example 4 is an add-in card that includes the subject matter of example 2 or 3, either including or omitting optional features, and wherein the support step is disposed between a bottom end of the contact finger and a point at which the pin is to make contact the contact finger when fully inserted.

Example 5 is an add-in card that includes the subject matter of example 2, 3, or 4, either including or omitting optional features, and wherein each of the contact fingers comprises a first portion with a first width and a second portion with a second width less than the first width, wherein the second portion is disposed below a point at which the pin is to make contact when fully inserted.

Example 6 is a computing device that includes a baseboard with a receptacle for receiving an add-in card. The receptacle includes pins. The computing device also includes an add-in card inserted into the receptacle. The add-in card includes a circuit board and contact fingers disposed on an outer surface of the circuit board to make contact with the pins. The computing device also includes a protection mechanism to prevent the pins from being captured between the contact fingers when inserted or removed. Optionally, the add-in card is compliant with a PCIe Card Electromechanical Specification and a width of the contact fingers is less than 0.7 mm. The add-in card may optionally transmit electrical signals at a frequency greater than 4.0 GigaHertz (GHz).

Example 7 is a computing device that includes the subject matter of example 6, either including or omitting optional features, and wherein the protection mechanism is included in the add-in card. For example, the protection mechanism may be a support step disposed between each of the contact fingers. The support step may include a plurality of support step segments that are electrically isolated from one another. The support step may optionally be a raised metal pad that is electrically isolated from each of the contact fingers.

Example 8 is a computing device that includes the subject matter of example 7, either including or omitting optional features, and wherein the gap between the edge of the support step and the edge of a nearest contact finger is less than a width of the pin.

Example 9 is a computing device that includes the subject matter of examples 7 or 8, either including or omitting optional features, and wherein the support step is disposed between a bottom end of the contact finger and a point at which the pin is to contact the contact finger when fully inserted.

Example 10 is a computing device that includes the subject matter of examples 6, 7, 8, or 9 either including or omitting optional features, and wherein each of the contact fingers comprises a first portion with a first width and a second portion with a second width less than the first width, wherein the second portion is disposed below a point at which the pin is to make contact the contact finger when fully inserted.

Example 11 is a computing device that includes the subject matter of example 6 either including or omitting optional features, and wherein the protection mechanism is a widening of the pins at a point where the pins makes contact with the contact fingers.

Example 12 is method of manufacturing an electronic device. The method includes forming contact fingers on an outer surface of a circuit board. Each of the contact fingers is configured to make electrical contact with a pin when inserted into a receptacle. A gap between the contact fingers is greater than or equal to a width of the pin. The method also includes forming a protection mechanism on a surface of the circuit board between the contact fingers to prevent damage to the pins and contact fingers during insertion and removal. Optionally, the add-in card is formed in compliance with a PCIe Card Electromechanical Specification. The width of the contact fingers may optionally be less than or equal to 0.7 mm.

Example 13 is a method that includes the subject matter of example 12 either including or omitting optional features, and wherein forming the contact fingers comprises forming a first portion with a first width and forming a second portion with a second width less than the first width, and wherein the second portion is positioned below a point at which the pin is to make contact the contact finger when fully inserted.

Example 14 is a method that includes the subject matter of example 12 or 13 either including or omitting optional features, and wherein forming the protection mechanism comprises forming metal pads between the contact fingers and electrically isolating the metals pads from the contact fingers. Optionally, forming the contact fingers and forming the metal pads can take place within the same metal patterning step.

Example 15 is a method that includes the subject matter of example 14 either including or omitting optional features, and wherein forming the metal pads comprises forming each of the metal pads in a plurality of electrically isolated segments.

Example 16 is a method that includes the subject matter of example 14 or 15 either including or omitting optional features, and wherein forming the metal pads comprises forming a gap between each of the metal pads and each neighboring contact finger, the gap being less than the width of the pin.

Example 17 is a method that includes the subject matter of example 14, 15 or 16 either including or omitting optional features, and wherein forming the metal pads comprises forming the metal pads between a bottom end of the contact finger and a point at which the pin is to make contact the contact finger when fully inserted.

Example 18 is a method of manufacturing an electronic device that includes forming a pin comprising a contact point to make contact with one of a plurality of contact fingers of an add-in card. The method also includes disposing the pin within a receptacle to receive the add-in card. Forming the pin also includes forming a protection mechanism that prevents the pin from being captured between the contact fingers. Optionally, forming the protection mechanism includes forming a widened portion at the contact point of the pin. For example, the widened portion may be greater than approximately 0.5 mm. Optionally, the pin is formed and disposed within the receptacle in compliance with a PCIe Card Electromechanical Specification.

Example 19 is a computing device that includes a baseboard with a receptacle for receiving an add-in card, the receptacle including pins. The computing device also includes a protection mechanism disposed on the pins to prevent the pins from being damaged by insertion or removal of the add-in card. Optionally, the pins and receptacle are compliant with a PCIe Card Electromechanical Specification.

Example 20 is a computing device that includes the subject matter of example 19, either including or omitting optional features, and wherein the protection mechanism is a widening of the pins at a point where the pins makes contact with the contact fingers. For example, a width of the pins at the contact point may be greater than approximately 0.5 mm. The pins are to contact corresponding contact fingers of the add-in card, and a width of the contact fingers may optionally be less than 0.7 mm.

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present invention.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc, which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An add-in card, comprising:
    a circuit board;
    contact fingers disposed on an outer surface of the circuit board, each of the contact fingers to make electrical contact with a pin when inserted into a receptacle, wherein a gap between the contact fingers is greater than or equal to a width of the pin; and
    a support step disposed between each of the contact fingers to prevent the pin from being captured between the contact fingers if the add-in card is misaligned when inserted or removed;
    wherein the support step comprises a plurality of support step segments that are electrically isolated from one another; and
    wherein the plurality of support step segments are made of the same material as the contact fingers, have the same thickness as the contact fingers, and are formed within the same metal patterning step as the contact fingers.

2. The add-in card of claim 1, wherein the support step is a raised metal pad that is electrically isolated from each of the contact fingers.

3. The add-in card of claim 1, wherein a gap between an edge of the support step and an edge of a nearest contact finger is less than a width of the pin.

4. The add-in card of claim 1, wherein the support step is disposed between a bottom end of the contact finger and a point at which the pin is to make contact the contact finger when fully inserted.

5. The add-in card of claim 1, wherein each of the contact fingers comprises a first portion with a first width and a second portion with a second width less than the first width, wherein the second portion is disposed below a point at which the pin is to make contact when fully inserted.

6. The add-in card of claim 1, wherein the add-in card is compliant with a PCIe Card Electromechanical Specification and a width of the contact fingers is less than or equal to 0.7 mm.

7. The add-in card of claim 1, wherein the add-in card is compliant with a PCIe Card Electromechanical Specification.

8. A computing device, comprising:
- a baseboard comprising a receptacle for receiving an add-in card, the receptacle including pins;
- an add-in card inserted into the receptacle, the add-in card comprising a circuit board and contact fingers disposed on an outer surface of the circuit board to make contact with the pins; and
- a support step disposed between each of the contact fingers to prevent the pins from being captured between the contact fingers when inserted or removed;
- wherein the support step comprises a plurality of support step segments that are electrically isolated from one another; and
- wherein the plurality of support step segments are made of the same material and have the same thickness as the contact fingers and are formed within the same metal patterning step.

9. The computing device of claim 8, wherein the support step is a raised metal pad that is electrically isolated from each of the contact fingers.

10. The computing device of claim 8, wherein a gap between an edge of the support step and an edge of a nearest contact finger is less than a width of the pin.

11. The computing device of claim 8, wherein the support step is disposed between a bottom end of the contact finger and a point at which the pin is to contact the contact finger when fully inserted.

12. The computing device of claim 8, wherein each of the contact fingers comprises a first portion with a first width and a second portion with a second width less than the first width, wherein the second portion is disposed below a point at which the pin is to make contact the contact finger when fully inserted.

13. The computing device of claim 8, wherein the add-in card is compliant with a PCIe Card Electromechanical Specification and a width of the contact fingers is less than 0.7 mm.

14. The computing device of claim 8, wherein the protection mechanism is a widening of the pins at a point where the pins makes contact with the contact fingers.

15. A method of manufacturing an electronic device, comprising:
- forming contact fingers on an outer surface of a circuit board, each of the contact fingers to make electrical contact with a pin when inserted into a receptacle, wherein a gap between the contact fingers is greater than or equal to a width of the pin; and
- forming a support step on a surface of the circuit board between the contact fingers to prevent damage to the pins and contact fingers during insertion and removal;
- wherein forming the support step comprises forming a plurality of support step segments that are electrically isolated from one another; and
- wherein forming the plurality of support step segments comprises forming the plurality of support step segments from the same material as the contact fingers, with the same thickness as the contact fingers, and in the same metal patterning step as the contact fingers.

16. The method of claim 15, wherein forming the contact fingers comprises forming a first portion with a first width and forming a second portion with a second width less than the first width, wherein the second portion is positioned below a point at which the pin is to make contact with the contact finger when fully inserted.

* * * * *